(12) United States Patent
Gertlowski et al.

(10) Patent No.: US 12,235,093 B2
(45) Date of Patent: Feb. 25, 2025

(54) METHOD FOR DESIGNING PACKAGING PLANTS

(71) Applicant: KRONES AG, Neutraubling (DE)

(72) Inventors: Georg Gertlowski, Schierling (DE); Tobias Schweiger, Walderbach (DE)

(73) Assignee: KRONES AG (DE)

( * ) Notice: Subject to any disclaimer, the term of this patent is extended or adjusted under 35 U.S.C. 154(b) by 463 days.

(21) Appl. No.: 16/625,494

(22) PCT Filed: Aug. 30, 2018

(86) PCT No.: PCT/EP2018/073377
§ 371 (c)(1),
(2) Date: Dec. 20, 2019

(87) PCT Pub. No.: WO2019/043112
PCT Pub. Date: Mar. 7, 2019

(65) Prior Publication Data
US 2021/0325171 A1    Oct. 21, 2021

(30) Foreign Application Priority Data
Aug. 31, 2017    (DE) .................... 10 2017 120 050.9

(51) Int. Cl.
*G01B 11/24*    (2006.01)
*G01B 11/28*    (2006.01)
(Continued)

(52) U.S. Cl.
CPC ............ *G01B 11/24* (2013.01); *G01B 11/285* (2013.01); *G01C 21/206* (2013.01); *G05D 1/0011* (2013.01)

(58) Field of Classification Search
CPC ....... G01B 11/24; G01B 11/285; G01C 11/30; G01C 21/206; G05D 1/0011; G05D 2201/0202; G06F 30/13; G06T 17/05
See application file for complete search history.

(56) References Cited

U.S. PATENT DOCUMENTS 6,009,359 A     12/1999   El-Hakim et al. ............... 701/28
8,525,836 B1 *  9/2013    Poursohi .................. H04L 67/10
                                                      345/611
(Continued)

FOREIGN PATENT DOCUMENTS

EP    2928243 A1 * 10/2015  ........... G01S 5/0252
JP    11183172        7/1989  ............ G01C 11/04
(Continued)

OTHER PUBLICATIONS

"Sanborn's Platform for Indoor Mapping," *Youtube*, Mar. 4, 2014, retrieved from the Internet: https://www.youtube.com/watch?v=UX9nOh3XiJs, retrieved on Dec. 10, 2018 (2 pgs).
(Continued)

*Primary Examiner* — Tarifur R Chowdhury
*Assistant Examiner* — Amanda Merlino
(74) *Attorney, Agent, or Firm* — HAYES SOLOWAY P.C.

(57) ABSTRACT

Disclosed is a method for designing a packaging plant, wherein a measuring vehicle is moved within an area in which the production plant is to be erected or modified, and a position of the measuring vehicle relative to the area is detected. The measuring vehicle is positioned at a plurality of positions within this area and at this position records respective images and/or data of the area with a first image capturing device, wherein at least one geometric property of the area and/or the packaging plant is detected.

15 Claims, 3 Drawing Sheets

(51) Int. Cl.
*G01C 21/20* (2006.01)
*G05D 1/00* (2006.01)

(56) References Cited

U.S. PATENT DOCUMENTS

| | | | |
|---|---|---|---|
| 9,885,573 B2 | 2/2018 | Van der Sluijs et al. | G01C 11/06 |
| 10,803,600 B2 | 10/2020 | Kaino et al. | G06T 7/246 |
| 2006/0089765 A1* | 4/2006 | Pack | G05D 1/0278 318/587 |
| 2006/0221072 A1 | 10/2006 | Se et al. | 345/420 |
| 2007/0090973 A1 | 4/2007 | Karlsson et al. | 340/995.22 |
| 2009/0093907 A1 | 4/2009 | Masaki et al. | 700/248 |
| 2012/0116728 A1* | 5/2012 | Shear | G06F 30/00 703/1 |
| 2012/0185115 A1* | 7/2012 | Dean | G05D 1/0038 701/2 |
| 2017/0203446 A1* | 7/2017 | Dooley | G05D 1/0088 |
| 2018/0144547 A1* | 5/2018 | Shakib | G06T 15/503 |

FOREIGN PATENT DOCUMENTS

| | | | |
|---|---|---|---|
| JP | 2015518138 | 6/2015 | G01B 11/00 |
| JP | 2015161577 | 9/2015 | G01M 99/00 |
| KR | 20180069539 A * | 6/2018 | G02B 27/017 |
| WO | WO2017057054 | 4/2017 | G01B 11/00 |

OTHER PUBLICATIONS

Brown, M., "Kinect-carrying drone automatically builds 3D maps of rooms," Mar. 31, 2011; retrieved from the Internet: https://www.wired.co.uk/article/kinect-drone, retrieved on Dec. 7, 2018 (2 pgs).
German Search Report (w/machine translation) issued in application No. 10 2017 120 050.9, dated Aug. 10, 2018 (17 pgs).
International Search Report (w/translation) and Written Opinion (w/machine translation) issued in application No. PCT/EP/2018/073377, dated Jan. 8, 2019 (21 pgs).
Japanese Official Action (w/machine translation) issued in application No. 2019-568742, dated Nov. 29, 2022 (7 pgs).

* cited by examiner

METHOD FOR DESIGNING PACKAGING PLANTS

BACKGROUND OF THE INVENTION

The present invention relates to a method for designing packaging plants and a corresponding device for designing packaging plants. The most varied large-scale plants are known from the prior art. The present invention is described with reference to packaging plants, but it is pointed out that the method described here can also be used, where appropriate, with modifications for different types of plant. In the present case packaging plants are generally understood to be plants which serve for packaging solid or liquid goods in the broadest sense.

Therefore, as is described in detail below, the invention relates in particular to a method and a device with a measurement system, which may for example include robots, image capturing devices, such as for example 3D cameras, and sensors, furthermore also including positioning systems and also, where appropriate, corresponding software which can serve for measurement, in particular for the provision of three-dimensional design models of machines and transport systems for the virtual plants.

It is known from the prior art that virtual plant design is performed in particular with 3D display and a corresponding program. In this case, however, the disadvantage arises that, depending upon the size of the plant, up to 200 positions must be taken manually with a 3D laser scanner in order thus to create an uninterrupted image of the plant including the environment thereof. In addition, problems can arise in practice if one or more measurement points are forgotten. In addition, it is a disadvantage that, after scanning, a design model must be created manually by means of specific software or a computer unit. The time taken for these procedures is considerable and can be several hours.

Furthermore, remote-controlled unmanned flying objects, sometimes designated as drones, quadrocopters or unmanned aerial devices, are known from the prior art. In some instances they are equipped with a camera device. Such flying objects can automatically fly previously defined routes, which can take place for example with GPS support. In this case such systems can produce images from a bird's eye perspective. It is also known from the internal prior art that 3D terrain models or 3D models of buildings can also be created. In addition, other transport devices are also known, for example so-called segways. However, a disadvantage when using such drones in buildings is that the GPS reception is not always available and thus also, for example, the drone can collide with objects in the area.

Therefore, the object of the present invention is to provide a method and a device for designing a packaging plant which enables corresponding design requiring less time by comparison with the prior art.

SUMMARY OF THE INVENTION

In a method according to the invention for designing a packaging plant a measuring vehicle is moved within an area in which the packaging plant is to be erected or modified, and in this case a position of the measuring vehicle relative to this area is detected.

According to the invention the measuring vehicle is positioned at a plurality of positions within the area and at these positions images and/or data of the area are in each case recorded by a first image capturing device, wherein at least one property of the area and/or the packaging plant is detected.

It is therefore proposed that at least one measuring vehicle is used, which records the corresponding data. The measuring vehicle can be both a flying object such as an above-mentioned drone or the like, and also a vehicle which moves on the ground. In this case it is possible that this vehicle travels predetermined routes. However, within the context of the invention in each case a position of this vehicle relative to the area is also recorded. Thus this measuring vehicle preferably forms a component of a measuring system for measurement of the area and/or the packaging plant.

In a preferred method the geometric properties of the area are selected from a group of properties which includes the area dimensions, a gradient of the area floor, obstacles within the area and in particular on the ground, for instance already existing plant parts, specific floor contours such as for instance slopes, an area height and the like. The term design is understood to mean both a redesign of the plant, that is to say erection of a completely new plant, and also a design of an extension for example in the event that a plant is to be expanded by specific plant parts or assemblies.

The packaging plant preferably has a plurality of components or a plurality of plant parts. Components of such packaging plants may be for example filling machines, labelling machines, blow moulding machines, sterilisation units, palettisers, depalettisers and the like. Thus the present invention relates in particular to packaging plants for packaging liquids and in particular beverages.

The measuring vehicle advantageously moves from the predetermined positions in a predetermined manner. In a further preferred method the measuring vehicle remains at specific points in order to record images. These may in each case be images which are recorded from the respective points in a plurality of directions. The measuring vehicle can be fixed or at least temporarily positioned at the predetermined positions.

In a further preferred method a three-dimensional model of the area is created on the basis of the data and/or images recorded by the first image capturing device. In contrast to procedures from the prior art which require a very large number of measurement points, in the present case it is proposed below to reduce the number of necessary recording points and in each case to look out from fixed locations in multiple directions. In this way complete images of the respective plant or also of the area can be created.

A model of the plant to be built or to be modified (for example, to be extended) is preferably also taken into account for designing of the plant. In this case in particular the dimensions of individual parts of this plant are taken into account. Transport paths or transport devices between these plant parts can preferably also be designed and in particular can be adapted to the area dimensions or the respective criteria or boundary conditions of the area.

Thus a method and a device are preferably provided, which provide a robot and a measurement system for measurement and in particular provision of three-dimensional data. In particular it is proposed that three-dimensional design models of machines and transport systems are provided, wherein this takes place in particular for virtual designing of the plant. In the simplest case the measuring vehicle or the robot can be a vehicle with two wheels and a corresponding controller, similar to a Segway. In addition, tracked vehicles can also be used in order for example to be able to overcome obstacles, such as for instance gullies, steps or the like.

In a further preferred method a three-dimensional model of the area and/or of the plant part located and/or to be arranged in this area is created on the basis of the data and/or images recorded by the first image capturing device.

As mentioned above, the vehicle may be a remote-controlled unmanned flying object.

In a further preferred method the measuring vehicle determines area dimensions. Thus, for example, the measuring vehicle can be configured with devices for distance measurement, or a measurement can be determined during a movement of the respective measuring vehicle having regard to a distance travelled. In this case the area dimensions are selected from a group of area dimensions which includes distances from walls, angles between walls, obstacles on the ground, already existing plant parts, inclinations of walls, curvature of wall contours, slopes of floors and the like.

In a further preferred method the position detection takes place by means of a navigation method and in particular a triangulation. Thus, for example, a WLAN or Bluetooth triangulation can be used in order to determine the position of the measuring vehicle in space. In the case of a flying object it is conceivable and preferred that this position is likewise detected three-dimensionally, that is to say by means of length, width and height co-ordinates.

In this case stationary position sensor devices can be provided, which in particular also simplify the navigation of the measuring vehicle in space and which in particular can also communicate—preferably bidirectionally—with the measuring vehicle. Furthermore, these position sensor devices themselves can also have image capturing devices which record three-dimensional images of the area. Thus the positions of these image capturing devices form further reference points for the creation of a plant model.

In a particularly preferred method a measuring vehicle is used which has at least two camera systems. In this case at least one camera is a 3D camera which preferably also has corresponding sensors for navigation. In this way a problem-free movement, for example driving of the measuring vehicle or also flying of the drone in closed areas can be achieved. As mentioned above, for example, a Bluetooth or WLAN triangulation can be used as a conceivable means for locating the position of the measuring vehicle inside the area.

Control of the measuring vehicle in space would be possible, for example, by means of a second camera and particularly preferably by means of a portable device such as, for example, a smartphone. For this purpose an app could be provided, such as for example the app FreeFlight known from the prior art. In addition, however, it would also be possible to use so-called VR headsets.

In a preferred method at least one camera and preferably both cameras is/are not installed rigidly, but preferably have at least one movable mounting or a movable support which can rotate and pivot if required. Particularly preferably the measuring vehicle has a running gear which can be retracted or extended as required. In this way the measuring vehicle can be switched into a movement mode or also stopped.

For this purpose the measuring vehicle can have an actuator unit which for instance can extend a support, which then enables stopping of the measuring vehicle at a specific position. This would also be possible in the case of an unmanned flying object. This could be stationed on the floor or on plant parts for instance for image recording.

The measuring vehicle preferably has a further camera, particularly preferably a 3D scanner which, during movement or preferably at a standstill, can produce scan strips and/or a point cloud. A 3D scan of the area and/or plant parts and/or the plant is preferably recorded at least intermittently.

Such point clouds are known in principle from the prior art and serve for determining 3D co-ordinates of objects to be measured and/or for generating alternative images. The point-resolving three-dimensional information of a surface thus recorded is preferably a point cloud.

In this case the point co-ordinates of the point cloud are preferably determined in relation to a co-ordinate system assigned to the measuring system. This co-ordinate system can preferably correspond to any co-ordinates of the respective area. Thus it is possible that, for example, at least two, preferably at least three, preferably four measurement points, for example WAN points, are positioned in a filling plant. These have a defined spacing relative to one another (determined by the dimensions of the area). The robot or the measuring vehicle is preferably equipped with corresponding wireless communication means, so that preferably an evaluation can perform a corresponding calibration of the robot or of the drone itself in the area. As mentioned above, further image recordings and/or 3D scans can also be carried out at these points.

In a further preferred method it would also be conceivable that images are recorded by means of the image capturing devices from a plurality of positions, wherein these images have areas in which they overlap.

It would likewise be conceivable to use an image to image processing program, wherein overlapping areas are scanned with the camera or laser scanner and predetermined areas and/or distinctive points are fixed which then, preferably by means of software, correspondingly produce a revised model and ultimately a complete design model.

Preferably in this case a scanner is used with at least a 165 megapixel HD image resolution, at least a distance accuracy of ±1 mm, at least a range of up to 150 m, and at least a scan speed of 500 000 points/s. AUTODESK RECAP would be conceivable as software.

In this case it would preferably be conceivable that an overlap of a plurality of recording points are automatically deleted and/or adapted by corresponding programming. This has the advantage that the quantity of data and/or computing power could be considerable reduced.

Laser scanners are known from the prior art which meet the above-mentioned criteria and in this way enable the fast and simple generation of a measurement even of complex objects. This image capturing device preferably has its own power supply, in particular a battery. However, it would also be conceivable that the image capturing device is supplied by a power supply of the measuring vehicle.

This image capturing device is preferably integrated Into a housing which protects against effects in the interior and also exterior, such as for instance dust, mist, water or the like.

The laser scanner is preferably also capable of carrying out measurements under different lighting conditions, for instance in rays of sunlight or other effects of extraneous light.

Thus in this case a navigation or positioning of the measuring vehicle takes place particularly preferably by means of WLAN navigation or with the aid of at least two, preferably at least three and preferably at least four WLAN measurement points.

In a further preferred method it would also be conceivable to use this WLAN connection and/or a router as additional measurement points for further detection of the position. In this way it is possible that in the event of a subsequent addition or checking of the three-dimensionally generated plant a calibration of the measuring vehicle can take place by means of the previously determined and stored measurement points. Thus, for example, a specific measurement point could be approached or also the measurement points could be approached in any sequence.

If no WLAN router is present, it would also be possible to retrofit such a WLAN router. In this case it would be possible to perform the assignment of the router to the corresponding machine or the location by the definite determination of the IP address, for example a MAC address. Additionally or alternatively, a mode would also be conceivable which—supported by corresponding software—in the measurement of the plant requests one, a plurality of or all routers to output a signal.

In a further preferred method, first of all the measuring vehicle is moved in a first operation between a plurality of positions within the area, in particular in order to determine position points, and then on the basis of these position points a three-dimensional model is created.

In a preferred method, in the context of a further operation the measuring vehicle is moved between a plurality of positions in order to increase the precision of the three-dimensional model.

Thus, it is possible, for example, that first of all the measuring vehicle is calibrated or a calibration of the robot takes place. Then in particular a manually controlled drive or a basic flight over the plant or the area can take place. In this case in particular the possible measurement points and also boundary conditions, such as for example possible obstacles, by the measurement area are detected and stored. In this case a 3D basic model is preferably generated, which is still relatively rough and, for example, detects contours of 50 mm or more, but as a rule this is sufficient in order to perform a further measurement flight or a further measurement drive without any collision of the measuring vehicle or the drone.

Preferably, after the analysis of this first flight or first drive a 3D design model can already be available, which may be compliant with different programs, for example Medusa 4 MPDS4, Mac, Android, AutoCad or the ike.

With this data now available, a subsequent second measurement flight or a second measurement drive can be fixed or corrected and carried out, in particular in order to obtain a precise 3D image or in order to undertake a collision check in order to obtain an exact design model.

Additional sensors could also be used, such as for example ultrasonic sensors, directional microphones, inclination sensors, laser range finders, laser trackers, marking devices, laser scanners and the like which are helpful for detection, determination control, measurement, the reception or the transmission of a signal, or the navigation or also marking and interaction.

Alternatively or in addition, however, an image processing program could also be used, wherein in particular overlapping areas are scanned with a camera or a laser scanner and in this case distinctive points are preferably fixed, which then by means of software produce an appropriately revised model and ultimately a complete design model.

As mentioned, with the 3D scan described here it is also possible to scan an area or an industrial building or also an industrial building under construction or plant. In this way the design reliability can be increased.

Furthermore, it would also be conceivable that, after a measurement of the area or the industrial building and a preferred corresponding implementation in a 2D or 3D model, a laser tracker is used. In the case of ongoing projects, in particular during installation of the plant, the measuring vehicle, in particular the robot or a drone, can predetermine exact fixed points if required or even mark them on the building floor, and these points then serve as precise reference points, for example, for the installation for instance of a filer of a stretch blow moulding machine or a labeling machine or other plant parts.

In addition, it would also be possible to use two measuring vehicles, for example a flying machine and a ground-based vehicle. Thus, for example, a drone can be used for measurement and a ground-based measuring vehicle can be used for colour marking. In addition it is also possible to carry out virtual reality training for future operators. The advantage of the invention also resides in the fact that virtual designing of the plant both by means of 3D scanning and also by means of measuring vehicles or drones are already currently technically feasible and in particular a corresponding control, in particular by means of software, is required in order to achieve this.

Therefore a self-propelled system for measurement and display of plants and buildings in the field of filling technology is preferably also used. Technologies for three-dimensional measurement of building and terrain structures can be installed on a self-propelled system, in this case the aforementioned measuring vehicle. Thus this measuring vehicle can drive independently in a building or on land and can collect data and images of different measuring points in a defined area. After data acquisition has taken place, the data and images can preferably be combined by software into a three-dimensional layout.

After the plant layout of the filling plant is finished, it can preferably be transferred again, in particular together with a three-dimensional layout of a terrain or building, to a measuring vehicle. The possibility now preferably exists of permanently or removably marking machine outlines, coloured resting surfaces, reference points for the installation and the like, in advance by the self-propelled system in the industrial building. Thus digital markings can also be implemented during the installation. Thus, for example, drilling patterns for the installation or the column installation or also the laying of cable routes can be represented.

As a result, scanning or observation of the area in which the plant is to be built or extended is preferably also possible.

The present invention further relates to a machine for designing a packaging plant with a measuring vehicle, which is movable within an area in which the production plant is to be erected or modified, with a control device to control the movement of this measuring vehicle and with a position detecting device which detects a position of the measuring vehicle relative to the area.

According to the invention the measuring vehicle has a first image capturing device which is suitable and intended to record images and/or data of the area, wherein at least one geometric property of the area and/or the plant can be detected. Therefore, with regard to the device it is proposed that a remote-controlled vehicle is used, the position of which within the said area can preferably be permanently detected. In a preferred embodiment the image capturing device is movable relative to the vehicle. In this case this device can be pivotable within a pivot plane or also within pivot planes. The image capturing device is preferably suitable and intended for recording a plurality of images and in particular also three-dimensional images. The image capturing device is preferably also suitable for recording image sequences and/or videos.

In a further advantageous embodiment the measuring vehicle has a further image capturing device which is controllable independently of the first image capturing device and which is suitable and intended for recording images of the area. In this case one image capturing device can be used for navigation and for controlling the measuring vehicle and the other image capturing device can be used for recording images of the area or the plant.

In a further advantageous embodiment the measuring vehicle has a 3D scanner. In this case this 3D scanner can serve, for example, as an image capturing device. In this case it is possible and preferable that such a 3D scanner records the above-mentioned point clouds.

In a further preferred embodiment a focus of at least one image capturing device is also variable. In this way area images with different radii can be recorded, for instance an image of a near region of a specific image capturing device and also an image of a far region.

In a further advantageous embodiment the second image capturing device serves for navigation of the measuring vehicle.

In a further advantageous embodiment the position detecting device has a signal transmission device or position sensor device which is arranged stationary. Thus, for example, beacons or the like could be provided at regions of the area. These signal transmission devices or position sensor devices advantageously communicate with the measuring vehicle. These position sensor devices or signal transmission devices also have image capturing devices, which are likewise suitable and intended for recording images of the area in which the plant is to be installed.

In this case, furthermore, it is possible that a plurality of such communication devices are provided, for example in the respective corners of the said compartment.

Further advantages and embodiments are apparent from the appended drawings.

DETAILED DESCRIPTION OF THE INVENTION

Figure 1:
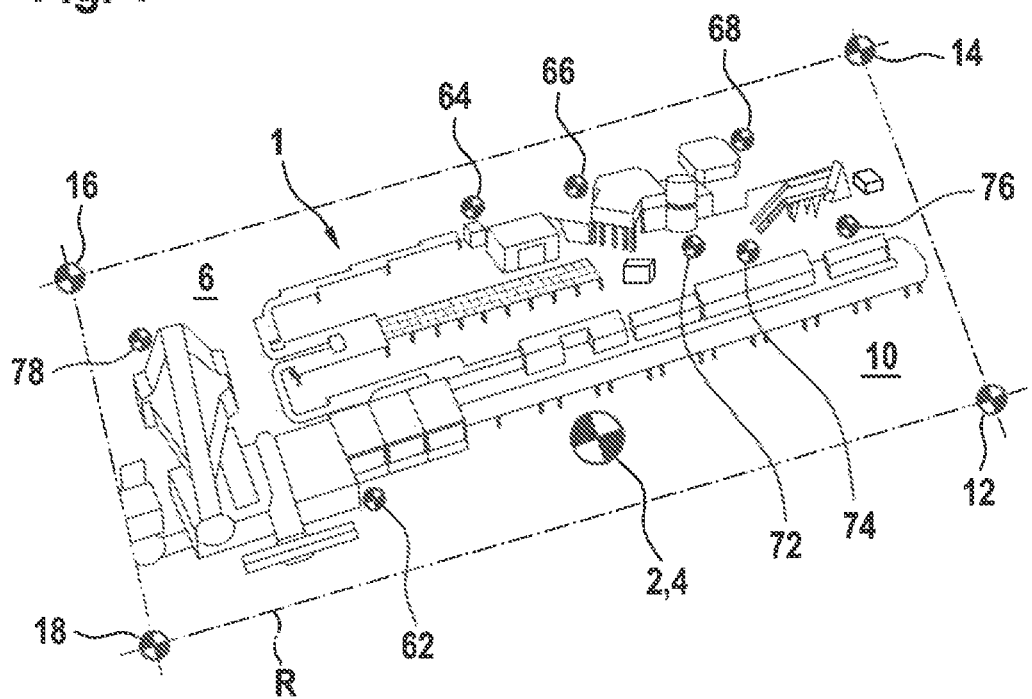
FIG. 1 shows a representation of a plant to be designed.

FIG. 1 shows a schematic representation for illustration of the designing of a plant 1. In this case the rectangle R shown by dash-dot lines designates an area within which the plant 1 is to be erected or to be modified, for example to be extended.

The references 12, 14, 16 and 18 here designate detection devices or signal generator devices, which are arranged stationary and are suitable and intended for positioning a measuring vehicle 2, 4 or detecting the position thereof. These detection devices 12, 14, 16 or 18 here are preferably arranged in the corners of the area 10. The measuring vehicle 2, 4, which may be either a land vehicle or an aircraft, can preferably move within the area 10. In this case it would also be possible to provide fewer or more than the position detection units 12, 14, 16, 18 shown.

The measuring vehicle 2, 4 can be moved within the area 10 and in this case for example can pass the individual reference points 62, 64, 86, 68, 72, 74, 76 and 78. In this case the frequency and density of these points depends, for example, on the respective plant or the complexity thereof or also the possibility of observing this in each case. It is also possible that by means of the individual detection or reference points 62-78 different plant parts of the entire plant 1 can be observed or measured. Therefore the reference points 62-78, which can be individually approached by land or air with the aid of the navigation, are preferably spaced apart or discrete from one another.

Figure 2:
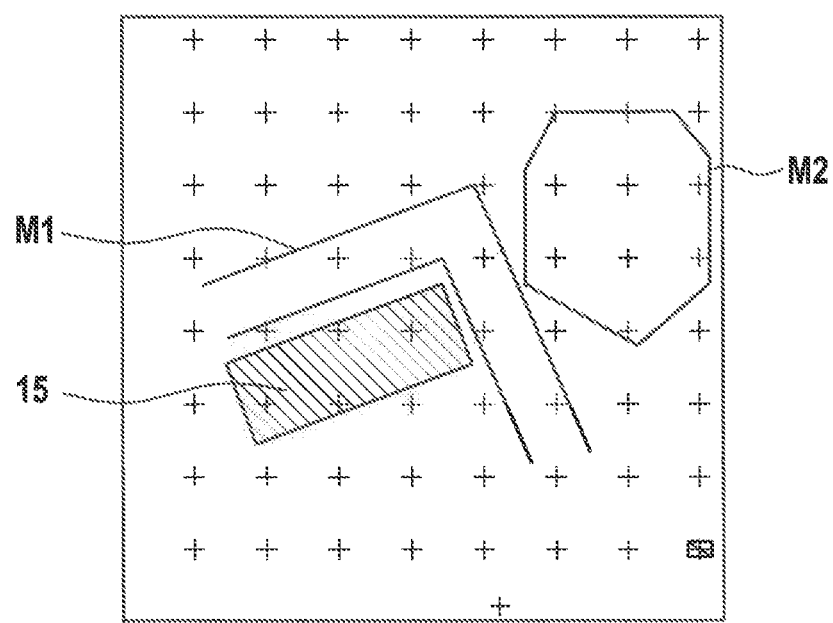
FIG. 2 shows a further representation of an area for designing of a plant.

FIG. 2 shows a further problem underlying the invention. Here again an area 10 is illustrated, within which a plant is to be constructed. In this case, for example, markings M1 can be provided, which should show a future travel path or a path which is accessible for the user. The measuring vehicle may also be suitable and intended for producing markings (for instance on the floor of the area). The fact that the said travel path or path which is accessible for the future user can be kept free of plant parts can then be taken into account for designing of the plant.

The reference 15 designates an object present within the area which, where applicable, must be taken into account in the designing of the plant. A marking M2 can designate a future machine position. Also in this case the measuring vehicle could again be moved within the area, in order to detect the corresponding criteria or conditions and accordingly design a plant in a further step.

Figure 3:
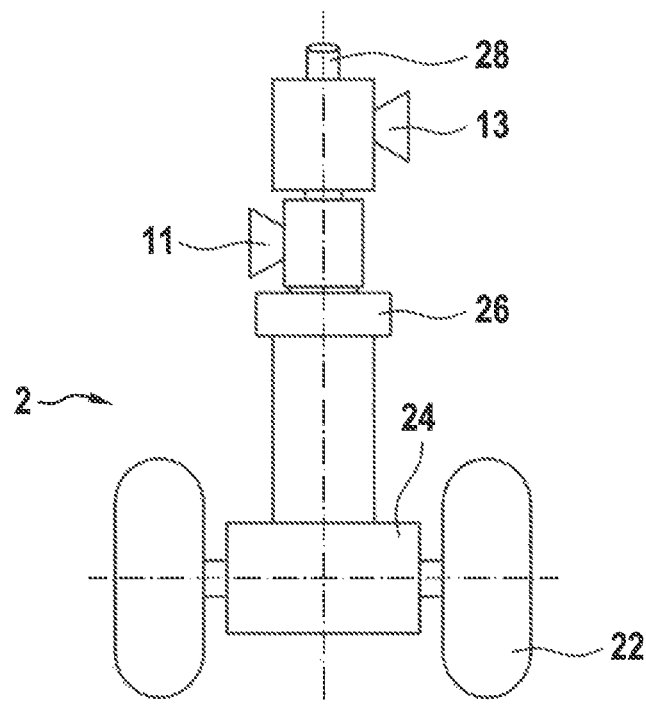
FIG. 3 shows a representation of a measuring vehicle.

FIG. 3 shows a first representation of a measuring vehicle, which is designed here as a ground-based measuring vehicle. This measuring vehicle here has wheels 22 for travelling on the ground. In this case these wheels can also be fixed, in order to fix the position of the measuring vehicle 1. In addition a drive 24 is provided in order to drive the wheels. Distance measuring devices can also be provided in order to determine a route to be travelled. The reference 24 designates a corresponding drive motor.

The reference 26 designates a mounting device for suspending a camera 11, so that this is in particular arranged rotatably and/or pivotably. The reference 13 designates a second camera which, for example, can have a 3D scanner or can be designed as a 3D scanner.

The reference 28 designates a sensor which can serve, for example, for detecting the position or also for navigation. In addition the measuring vehicle 2 could have a stand (not shown), for example also an extendable stand, by means of which the camera devices 11 and 13 could be extended. In this way a scanner position can also be moved vertically.

Figure 4:
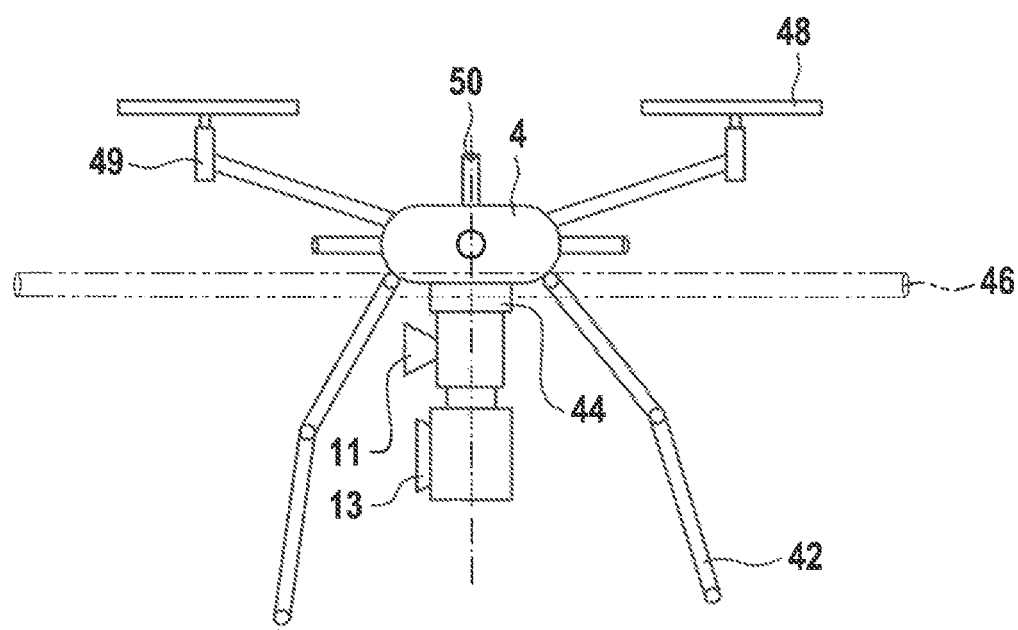
FIG. 4 shows a further representation of a measuring vehicle.

FIG. 4 shows a further example for a measuring vehicle 4, in this case in the form of a drone. This drone has a plurality of propellers, for example four propellers 48. Here too a position detecting device 50 is again provided, which serves in order to detect the position of the drone. The reference 44 again designates a movable mounting for a first image capturing device 11 as well as a second image capturing device 13. These can again be mounted pivotably and/or rotatably. The reference 42 designates a chassis of the drone or of the measuring vehicle 4. In this way in this case the drone could also be fixed at specific positions for example on the ground or also on equipment.

The reference 51 designates a further sensor device, such as for instance a distance sensor device.

Figure 5:
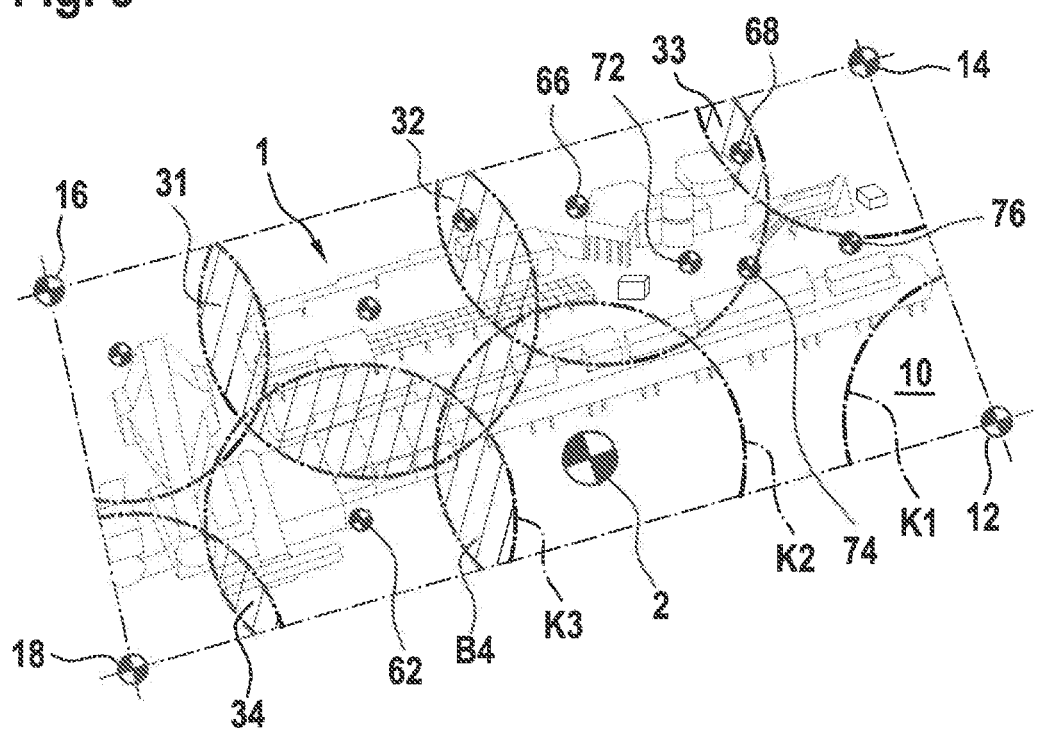
FIG. 5 shows a further illustration of a plant design.

FIG. 5 shows a representation for illustrating the designing of the plant. This again shows the area 10 according to FIG. 1. Furthermore, areas which are detected by the image capturing devices at the respective positions, for instance the position 66 or the position 62, are in each case shown by circular lines K1, K2, K3. It will be recognised that almost the entire plant can be detected with these areas. In addition there are overlap areas 31, 32, 33 and 34, which can be observed simultaneously from a plurality of positions. Additional image capturing devices for detecting the area and/or plant parts can also be provided at the positions of the position sensor devices 12, 14, 16, 18.

In particular, therefore, the number of possible recording positions can be drastically restricted by the recording of all-round images, and in this way overall with comparatively few recordings an entire image of the plant can be created and this in turn can form the basis for designing the plant.

The applicant reserves the right to claim all the features disclosed in the application documents as essential to the invention in so far as they are individually or in combination novel over the prior art. Furthermore it is pointed out that features which may be advantageous per se have also been described in the individual drawings. The person skilled in the art recognises immediately that a specific feature described in a drawing may also be advantageous without the incorporation of further features from this drawing. Furthermore the person skilled in the art recognises that advantages may also result from a combination of several features shown in individual drawings or in different drawings.

LIST OF REFERENCES

1 plant
2 measuring vehicle
4 measuring vehicle
10 area
11 camera/image capturing device
12, 14, 16, 18 stationary detection unit
13 second camera/image capturing device
15 object present
22 wheels
24 drive (motor)
26 mounting device
28 sensor
31-34 overlap area
42 chassis of the drone
44 movable mounting
48 propeller
50 position detecting device
51 further sensor device
62, 64, 66, 68 reference point
72, 74, 76, 78 reference point
K1-K3 circles
M1 marking of a future route
M2 future machine positions
R rectangle

The invention claimed is:

1. A method for designing a packaging plant comprising the steps:
    moving a measuring vehicle within an area in which a packaging plant is to be erected or modified;
    providing stationary position detection devices, which can communicate with the measuring vehicle;
    detecting a position of the measuring vehicle relative to the area by the stationary position detection devices, wherein the measuring vehicle is positioned at a plurality of positions within the area, wherein the measuring vehicle predetermines exact fixed points if required or marks them on a building floor, and these points then serve as precise reference points, and wherein the measuring vehicle marks permanently or removably machine outlines, coloured resting surfaces or reference points for the installation in advance in the area, wherein these position detection devices themselves also have image capturing devices which record three-dimensional images of the area, wherein the positions of these image capturing devices form further reference points for the creation of a three-dimensional model of the area and of a plant part to be arranged in this area;
    recording at this position respective images and/or data of the area with a first image capturing device of the measuring vehicle and recording images and/or data of the area with the image capturing devices of the stationary position detection devices, wherein at least one geometric property of the area and/or the packaging plant is detected; and
    creating the three-dimensional model of the area and of a plant part to be arranged in this area on the basis of the data and/or images recorded by the first image capturing device of the measuring vehicle and by the image capturing devices of the stationary position detection devices, wherein a model of the packaging plant to be built or modified is taken into account for designing of the plant.

2. The method according to claim 1, wherein the measuring vehicle is a remote-controlled vehicle.

3. The method according to claim 1, wherein the measuring vehicle determines area dimensions.

4. The method according to claim 1, wherein the position detection takes place by a navigation method.

5. The method according to claim 1, wherein at least one three-dimensional scan is recorded.

6. The method according to claim 1, wherein the measuring vehicle is moved in a first operation between a plurality of positions within the area, in order to determine position points, and on the basis of these position points a three-dimensional model is created.

7. The method according to claim 6, wherein in the context of a further operation the measuring vehicle is moved between a plurality of positions in order to increase the precision of the three-dimensional model.

8. The method according to claim 1, wherein the dimensions of individual parts of the packaging plant are taken into account.

9. The method according to claim 1, wherein three-dimensional design models of machines and transport systems are provided, wherein this takes place for virtual designing of the plant.

10. The method according to claim 1, wherein a navigation or positioning of the measuring vehicle takes place with the aid of WLAN navigation or with the aid of at least two, three or four WLAN measurement points.

11. A device for designing a packaging plant comprises a measuring vehicle, which is movable within an area in which the packaging plant is to be erected or modified, a control device configured to control the movement of the measuring vehicle and a position detecting device configured to detect a position of the measuring vehicle relative to the area, wherein the position detecting device is a wireless communication sensor, wherein the measuring vehicle has a first image capturing device which is configured to record images and/or data of the area, wherein at least one geometric property of the area can be detected, wherein a three-dimensional model of the area and of a plant part located and/or to be arranged in the area is created on the basis of the data and/or images recorded by the first image capturing device, wherein the first image capturing device is movable and is configured to be pivotable, inclinable and rotatable relative to the measuring vehicle, wherein the measuring vehicle has a running gear, which can be retracted or extended, wherein the measuring vehicle is configured to be switched into a movement mode or stopped and wherein the measuring vehicle has an actuator unit which is configured to extend a support, which then enables stopping of the measuring vehicle at a specific position, wherein the measuring vehicle has a second image capturing device which is controllable independently of the first image capturing device and which is configured for recording images of the area, and wherein the second image capturing device is movable and is configured to be pivotable, inclinable and rotatable relative to the measuring vehicle, and wherein the position detecting device has at least one signal transmission device arranged on a stationary manner, wherein the signal transmission device is a beacon or a WLAN point and wherein the position detection device has an image capturing device which records three-dimensional images of the area.

12. The device according to claim 11, wherein the measuring vehicle has a 3D scanner.

13. The device according to claim 11, wherein the second image capturing device serves for navigation of the measuring vehicle.

14. The device according to claim 11, wherein at least the first camera or the second camera, or both the first and the second cameras is/are not installed rigidly, but have at least one movable support configured to rotate and pivot.

15. A method for designing a packaging plant comprising the steps:
   moving a measuring vehicle within an area in which a packaging plant is to be erected or modified;
   providing stationary position detection devices, which can communicate with the measuring vehicle;
   detecting a position of the measuring vehicle relative to the area by the stationary position detection devices, wherein the measuring vehicle is positioned at a plurality of positions within the area, wherein the measuring vehicle predetermines exact fixed points if required or marks them on a building floor, and these points then serve as precise reference points, and wherein the measuring vehicle marks permanently or removably machine outlines, coloured resting surfaces or reference points for the installation in advance in the area, wherein these position detection devices themselves also have image capturing devices which record three-dimensional images of the area, wherein the positions of these image capturing devices form further reference points for the creation of a three-dimensional model of the area of a plant part to be arranged in this area;
   recording at this position respective images and/or data of the area with a first image capturing device of the measuring vehicle and recording images and/or data of the area with the image capturing devices of the stationary position detection devices, wherein at least one geometric property of the area and/or the packaging plant is detected; and
   creating the three-dimensional model of the area and of a plant part located and a plant part to be arranged in this area on the basis of the data and/or images recorded by the first image capturing device of the measuring vehicle and by the image capturing devices of the stationary position detection devices, wherein a model of the packaging plant to be built or modified is taken into account for designing of the plant.

* * * * *